United States Patent [19]
Bronson

[11] 3,965,468
[45] June 22, 1976

[54] LOGIC PULSER
[75] Inventor: Barry Steven Bronson, Campbell, Calif.
[73] Assignee: Hewlett-Packard Company, Palo Alto, Calif.
[22] Filed: Jan. 17, 1975
[21] Appl. No.: 541,806

[52] U.S. Cl. ............................. 340/349; 340/331
[51] Int. Cl.² ...................................... G08C 1/00
[58] Field of Search ............ 340/349, 351, 331, 410

[56] References Cited
UNITED STATES PATENTS
2,716,230 8/1955 Oliwa.............................. 340/349

OTHER PUBLICATIONS
Pulse Generator Has Wide Control Range, W. W. Schroeder, Mar. 1953, pp. 136, 137 Electronics.

*Primary Examiner*—Thomas B. Habecker
*Attorney, Agent, or Firm*—Ronald E. Grubman

[57] ABSTRACT

A logic pulser is disclosed which provides controlled pulses for stimulating a digital logic circuit under test. The pulser is serially programmed, e.g. by means of a manually operated push button switch to generate single pulses, continuous streams of pulses, or bursts of pulses.

The pulser may include a visual output indicator such as an LED which flashes in a predetermined sequence to indicate in which mode the pulser is operating.

The pulser may also include output circuitry which sets the voltage and automatically adjusts the width of the output pulses to provide appropriate net charge to different types of digital circuitry.

6 Claims, 8 Drawing Figures

LOGIC PULSER

BACKGROUND OF THE INVENTION

For the testing of digital circuitry it is often desirable to have the capability of injecting test pulses into selected points of the circuit under test. For such purposes it is known to use an external pulser to induce changes of state (high to low, or low to high) at appropriate points in the digital circuit. Logic pulsers are known in the art which provide single pulses and/or a continuous stream of pulses to the circuit under test. However, for many test purposes it is desirable to provide not only single pulses or continuous pulse streams but also repeating bursts of a fixed number of pulses.

To select among the possible output functions of a pulser, it is desirable to have an extremely simple mode select mechanism; preferably mode selection should not be accomplished by a simple mechanism which can be incorporated into a hand-held device, such as are finding wide acceptance in the art. In known devices function selection and control are typically performed by cumbersome switches or even involve instrumentation external to the pulse generator itself.

With the advent of different types of digital circuitry, e.g. DTL, TTL, and CMOS, it is becoming of importance to have a logic pulser which can be operated to compatibly stimulate any of these types. In particular a logic pulser should be capable of generating fast edge pulses to drive CMOS logic at suitable voltages (typically 5–15V), and yet automatically adjusting its output voltage and pulse width to protect DTL and TTL devices.

SUMMARY OF THE INVENTION

In accordance with the illustrated preferred embodiments the present invention provides a logic node stimulator (logic pulser) for injecting controlled pulses into a digital logic circuit under test. The pulser provides individual stimulating pulses, continuous streams of pulses at a number of different pulse repetition rates, or recurring pulse bursts containing known numbers of pulses. The invention utilizes digital circuitry in conjunction with a programmable memory (ROM or ROAM) to provide a series coding scheme for selecting among the various operating modes. More particularly, a single activating element such as a simple push button may be utilized to select among the operating modes by pushing and/or holding the button according to a preset code. Function selection according to such a single button series coding scheme is particularly well adapted for hand-held test instruments in which more complicated apparatus would be cumbersome and difficult to use.

According to the illustrated embodiments, the present invention also includes a flashing indicator light which blinks in different patterns to indicate which of the various pulse functions is presently being supplied by the device.

Also in accordance with the illustrated preferred embodiments the invention provides output pulses which are suitable for driving CMOS, DTL, or TTL digital logic. More particularly, the device includes an output sensing circuit which senses the current being supplied to the circuit under test and automatically adjusts the width of the output pulses to be compatible with the different types of digital logic circuitry so as to protect them from overstress when improper voltage or current conditions are present.

DESCRIPTION OF THE PREFERRED EMBODIMENT

Figure 1:
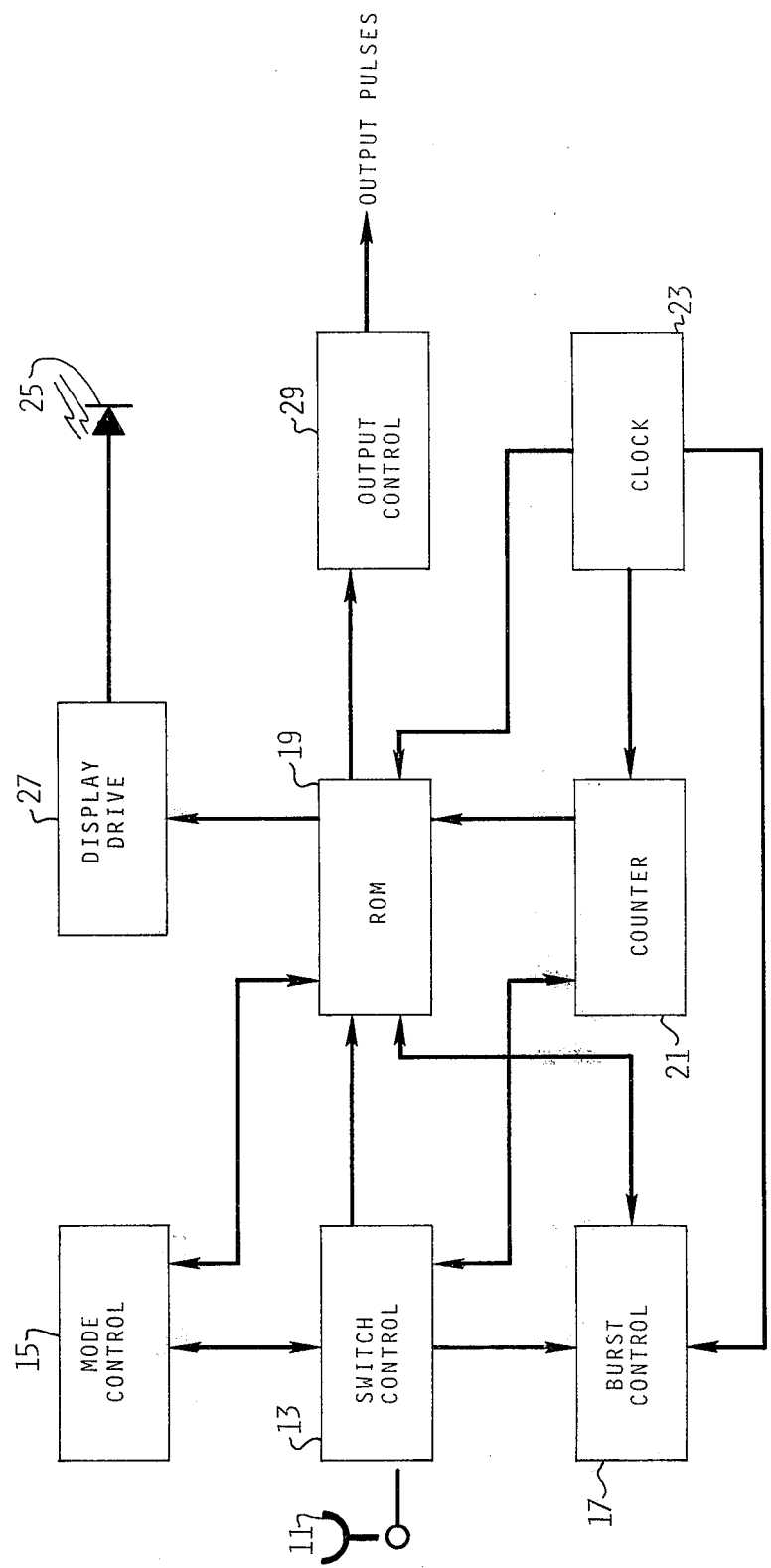
FIG. 1 is a simplified block diagram of a logic pulser in accordance with a preferred embodiment of the invention.

In FIG. 1 there is illustrated a switch 11. Preferably, the switch is a simple push button which may be depressed manually and will automatically return to its nominal "up" position upon being released. The switch may also have the capability of being locked in the down or "push" position. For example, a push/slide switch as is known in the art would be suitable. As will be described in more detail hereinbelow switch 11 is utilized to program the operation of the pulser by means of a sequence of "push" and "hold" operations which are manually performed on the switch. Each different sequence represents a serial code which serves to program the device. In a preferred embodiment of the invention the pulser includes six modes of operation which are serially coded according to the following:

1. a single pulse output is produced for each single push of the activator switch 11;
2. a continuous stream of pulses at a 100 Hz rate is generated by pushing the activator switch 11 and holding the switch in the depressed condition (denoted hereinafter as "push-hold") for longer than a predetermined wait time, for example, 1 second. If the switch is provided with a locking feature it may, of course, be locked in the hold position;
3. push-push-hold of the switch generates bursts of 100 pulses at a predetermined rate (for example, 100 Hz) with a pause between bursts, e.g. a 1 second pause.
4. push-push-push-hold generates a continuous stream of pulses at a 10 Hz rate;
5. push-push-push-push-hold generates bursts of 10 pulses at a known pulse rate;
6. five or more pushes and a hold generates a continuous stream of pulses at a 1 Hz rate (i.e., 1 pulse per second, indefinitely).

The pulser may thus operate in a single shot mode, in various continuous modes, or in a pulse burst mode. The various pulse rates, etc. mentioned above are suitable for many logic testing applications and are therefore preferable; but it is evident that the serial coding technique of the present invention is not limited to the particular functions listed and may also be employed to program other operational modes.

Referring again to FIG. 1, the signals from switch 11 are processed in a switch control unit 13 which includes a number of multi-level logic gates and delay elements. The switch control unit serves to signal process the information from switch 11, for example, by debouncing the switch signal. Switch control unit 13 also sets and resets various counters which establish timing and delay intervals.

A mode control circuit 15 is interconnected with switch control 13. The mode control circuit includes a number of gates and counters which determine firstly whether the pulser is operating in an idle mode, a programming mode in which it is awaiting further control pulses from the switch, or an execution mode in which pulses are being generated. Additionally, the mode control circuit accumulates impulses from the program switch to define the mode into which the pulser is programmed. A more detailed description of the structure and operation of mode control unit 15 will be related hereinafter in connection with FIG. 4.

As was briefly described above, the invention provides that the pulser may generate controlled bursts of pulses of a predetermined number and fixed frequency. These pulses are initiated and terminated by a burst control unit 17 which may comprise, e.g. several flip-flops and a latch. In addition to initiating and terminating the bursts, the burst control unit also generates a delay signal to implement an appropriate pause between bursts. In the burst mode, it is important that a precisely desired number of pulses be included in each burst initiated by a serial code command (such as push-push-hold). However, some difficulty occurs with respect to the initial burst in a series, since each of the first two manual "pushes" of switch 11 will generate a single pulse; for the initial burst only then, burst control unit 17 should generate only 98 additional pulses.

The above-described control of burst control unit 17 is accomplished by means of a programmable memory unit 19 such as a Read Only Memory (ROM). ROM 19 is interconnected with switch control unit 13, mode control unit 15 and burst control unit 17. The memory is programmed to function as a master logic unit controlling the interaction among all of the other circuit elements.

A digital counter 21 is used to provide time intervals and counting indices to the other circuit blocks in the device. The counter is driven by a clock 23 which provides a standard time reference.

In a preferred embodiment of the invention a visual display 25 such as a light emitting diode (LED) is used to indicate the operational mode of the device at any time. To accomplish this purpose, display 25 is driven by a display drive 27 which applies a gated constant current to the display device. For example, the indicator may show a single short flash when a single pulse is outputted. Continuous fast blinking may indicate operation in the continuous 100 Hz mode while continuous slow blinking may indicate that the pulser is outputting a continuous stream of pulses at 10 Hz. Similarly, fast blinking with pauses may be used to indicate bursts of 100 pulses while fast blinking for a shorter time period with longer pauses may indicate the 10 burst mode. If the device is outputting pulses at a 1 Hz rate, the display may simply blink at that rate to indicate same. All of these different indications are controlled by ROM 19 which is programmed to suitably activate display drive 27 for each mode. It is evident that these particular display indications are merely illustrative of many different display codes which could be employed.

An output control circuit 29 is responsive to ROM 19 for generating stimulating pulses to a digital circuit under test. As will be described more fully below, output control 29 includes a one-shot circuit to generate pulses of a nominal pulse width. Also included are a pair of output sensing circuits which sense the output current when the positive or negative going pulse is being generated. Current oversense conditions cause the pulse to be prematurely terminated to avoid damage to the logic elements of the instrument under test, and to guarantee fast slew rates through the logic threshold region.

Figure 2:
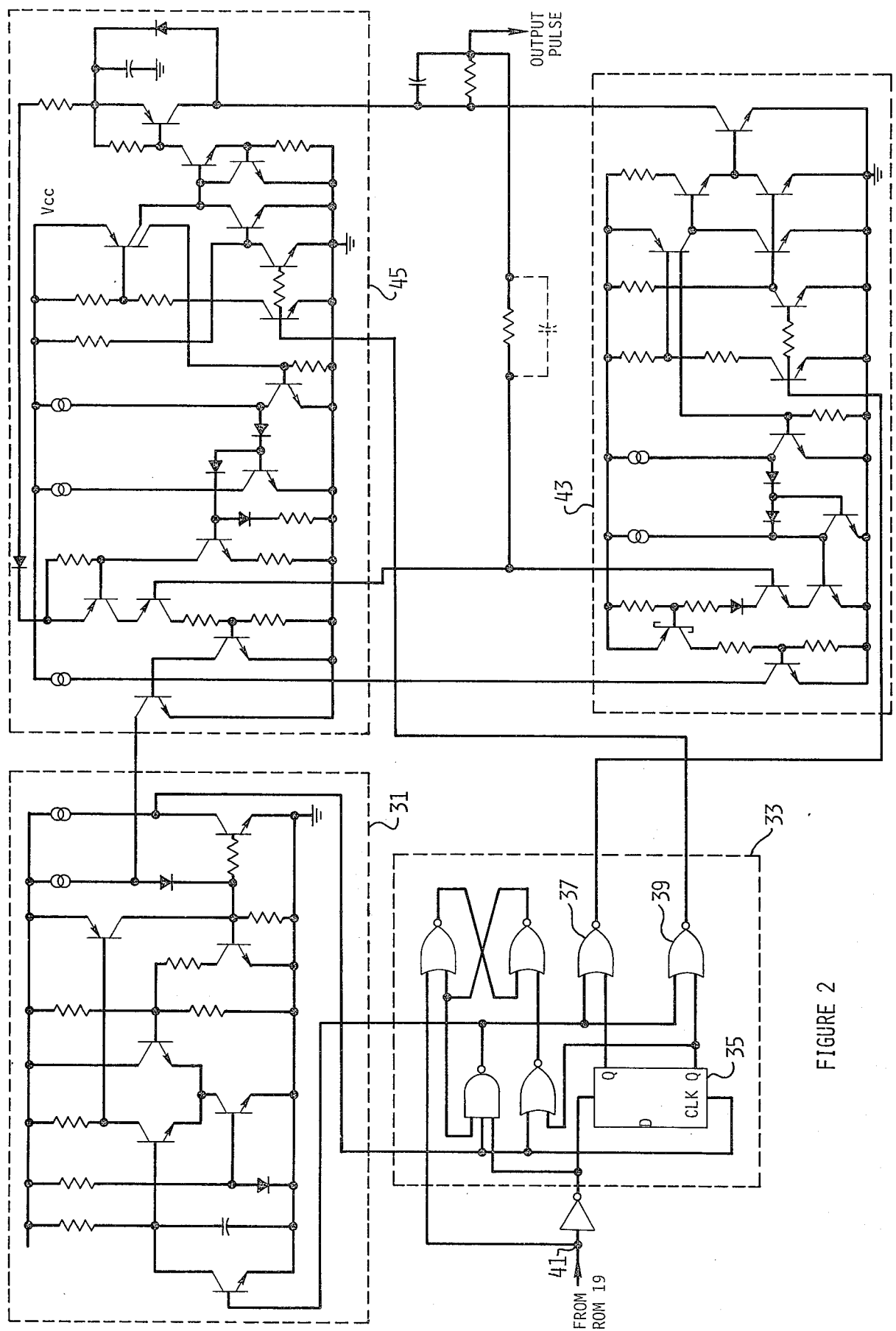
FIG. 2 illustrates in more detail a preferred embodiment of an output circuit according to the invention.
Figure 3A:
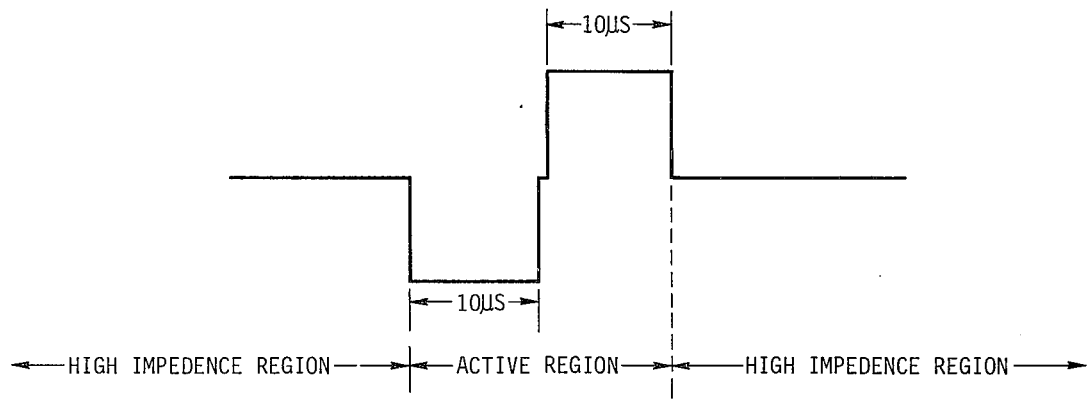
FIGS. 3A, 3B, and 3C show several typical (single) pulses which would be supplied by the pulser to different types of logic circuitry under test.
Figure 3B:
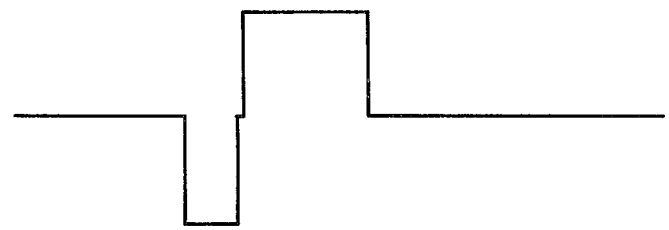
Figure 3C:
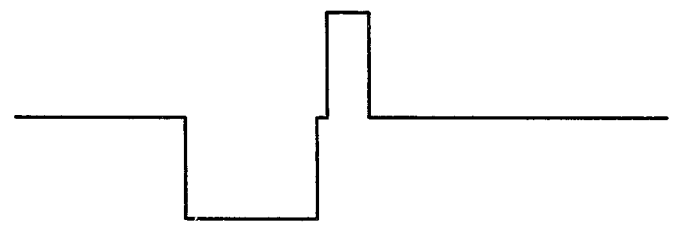

By reference now to FIGS. 2 and 3 there will be described features of the invention which enable the pulser to generate output pulses which are suitable for driving either CMOS logic or DTL or TTL logic while providing overload protection in all cases. In FIG. 2 there is illustrated in more detail an example of particular circuitry which may be included in output control unit. A "one-shot" circuit 31 is used to control the nominal pulse width of the positive and negative portions of the pulses which are outputted from the device. For example, by suitably choosing the values of the various components in one-shot circuit 31 pulses can be generated having a nominal pulse width of about 10 microseconds as indicated in FIG. 3a. More specifically it may be seen from FIG. 2 that one-shot circuit 31 is interconnected with a pulse output circuit 33 which includes a flip-flop 35. The Q and Q outputs of flip-flop 35 drive gates 37 and 39 which output respectively the negative and positive portions of the output pulses. The triggering of pulse output circuit 33 is controlled by ROM 19 as indicated by an input 41 therefrom. In operation a negative pulse of a nominal width such as 10 microseconds is almost immediately followed by a positive pulse of the same pulse width as indicated in FIG. 3a. However, according to the present invention there are included a pair of output sensing circuits 43 and 45. These function to sense whether excessive charge (or current) is being supplied to the circuit under test during the negative or positive portions of the output pulse respectively. This can be done, e.g. by measuring the voltage developed across a charge coupling capacitor. For example, if the "zero" sense circuit 43 detects that excessive current is being drawn during the negative portion of a pulse, it generates a signal to one-shot circuit 31 which terminates the negative going portion of the output pulse. Immediately following the termination of this negative going portion, the device will attempt to output a positive portion of nominal pulse width; the resulting pulse is illustrated in FIG. 3b. Similarly, if an overcurrent situation is sensed by "one" sense circuit 45 during the positive portion of an output pulse, "one" sense circuit 45 will direct a signal to one-shot circuit 31 which terminates the positive portion of the output pulse as in FIG. 3c. By utilizing this output driving circuit the pulser can generate pulses of sufficient width to drive CMOS logic but can automatically generate narrower pulse widths when driving TTL or DTL logic thereby reducing the overall charge delivered to the logic under test to provide overload protection. This is especially important when the supply voltage to the pulser (which programs the output "one" voltage) is in excess of the voltages necessary for driving DTL or TTL logic. A "zero" or "one" output pulse is terminated with a fast trailing edge so as to eliminate the possibility of multiple triggering of the logic due to a slow transition through its threshold.

Figure 4A:
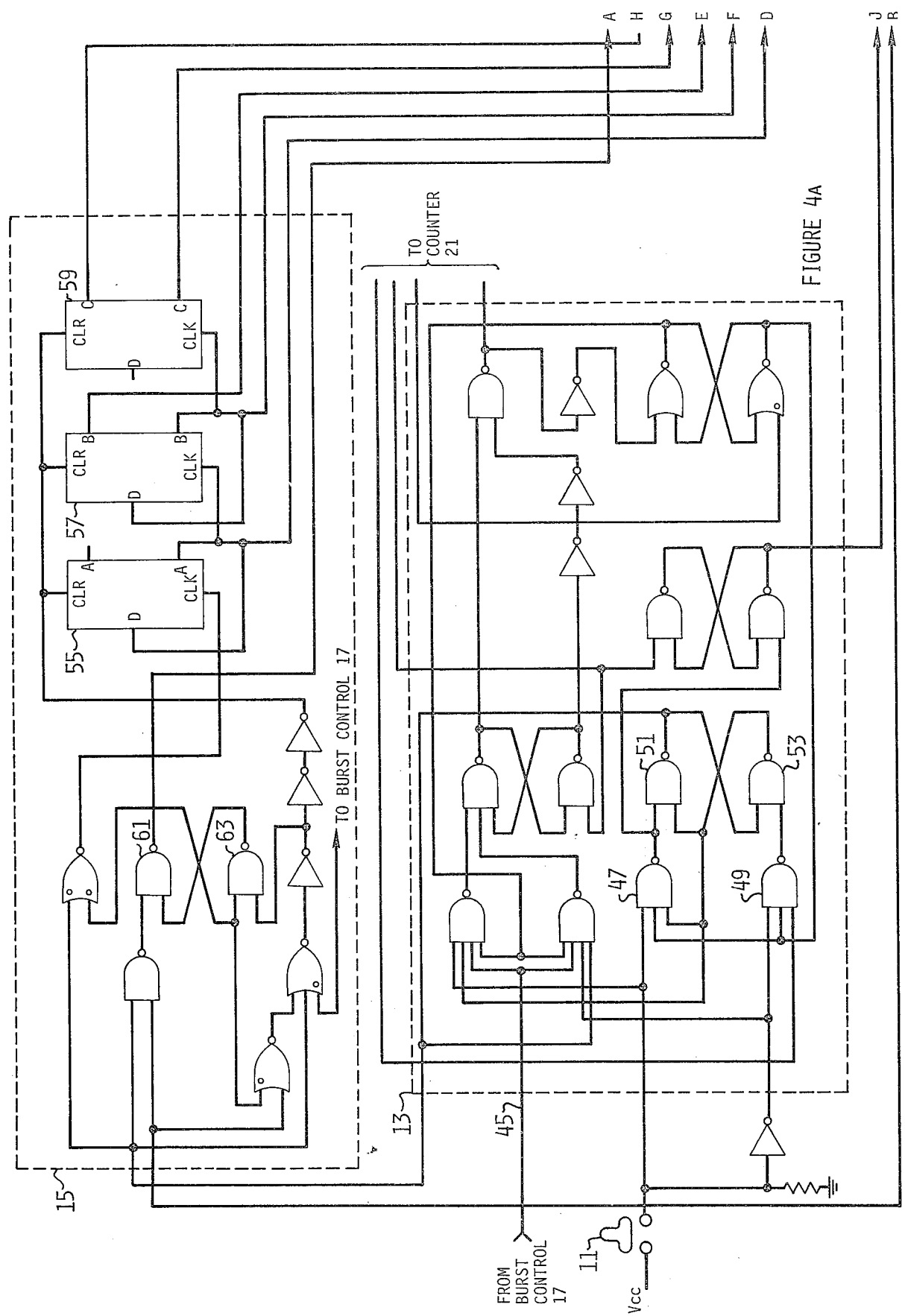
FIGS. 4A, 4B and 4C illustrate in more detail some of the circuit elements of the pulser including a programmable memory unit.
Figure 4B:
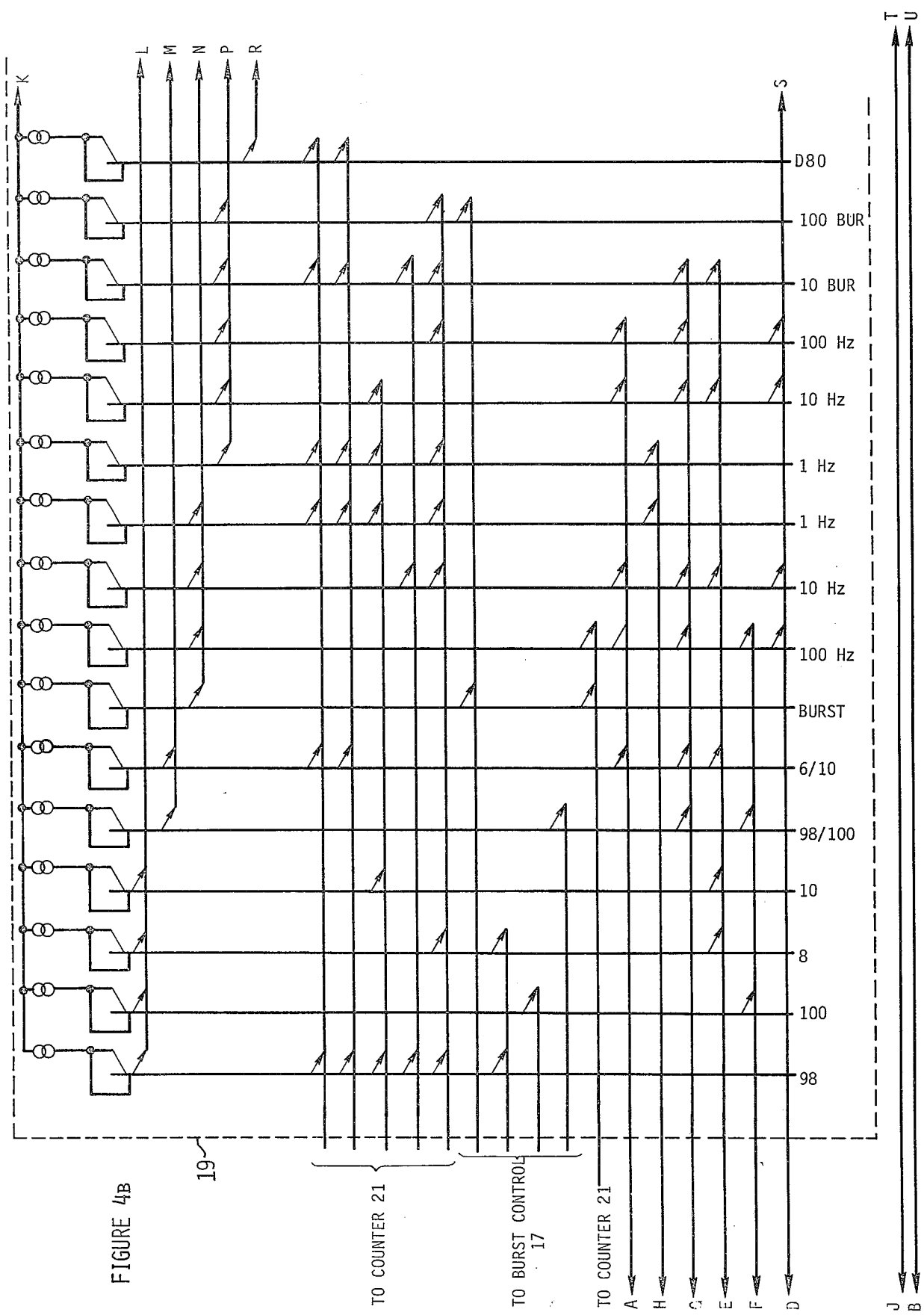
Figure 4C:
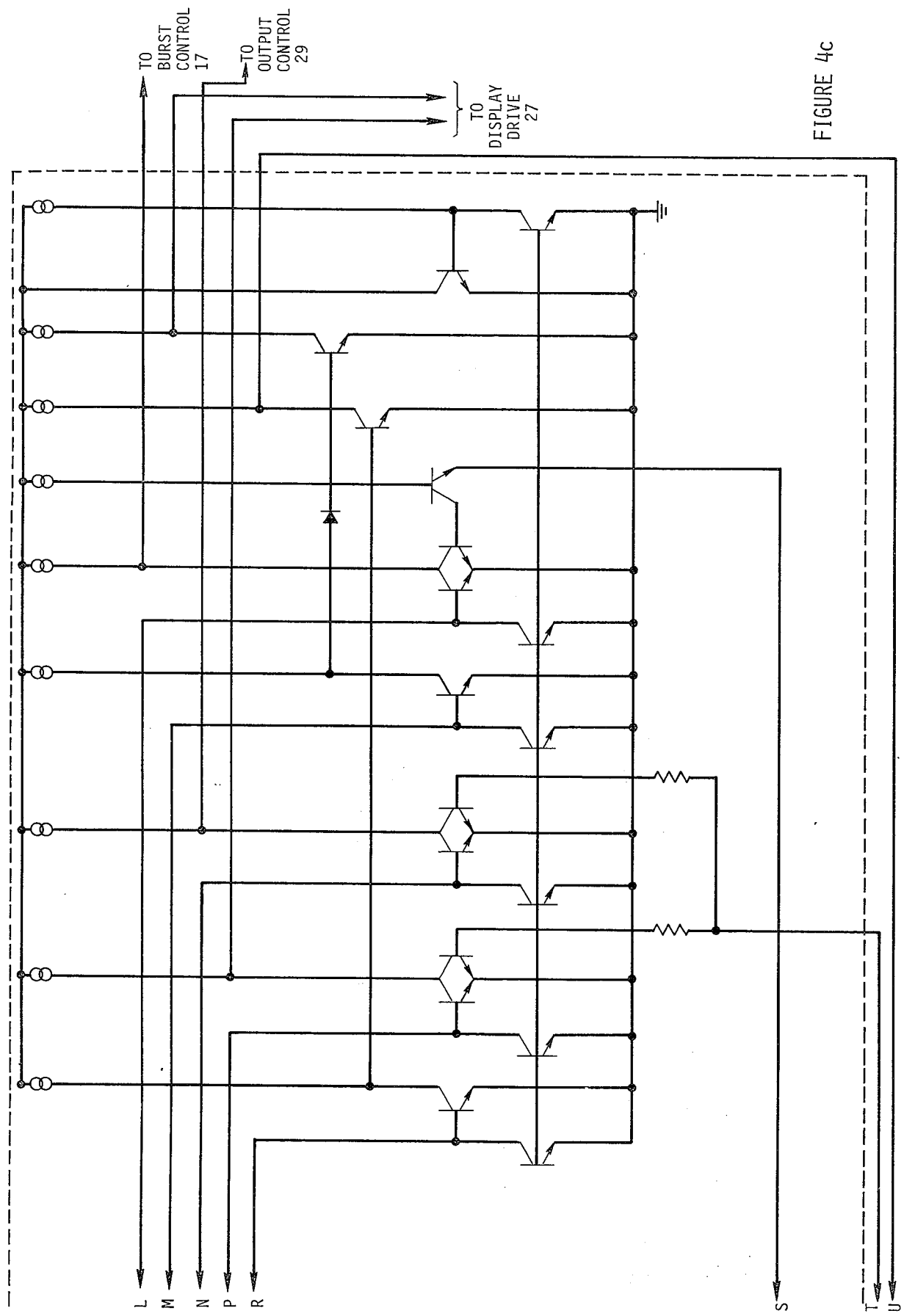

FIG. 4 illustrates in more detail programmable memory 19, mode control unit 15, switch control unit 13, and the various interconnections therebetween. As an example of the operation of the pulser, assume that it is desired to generate a burst of 100 pulses. According to the serial coding scheme described above, this would require that switch 11 be manually depressed twice and held (or locked) down —i.e. push-push-hold. When switch 11 is depressed once switch control unit 13 serves to debounce the signal therefrom and also to reset various counters in the pulser. More particularly the output of gate 43 is a master reset line which resets counter 21 and also certain flip-flops in burst control unit 17. Should switch 11 be manually released while a burst of pulses is in progress then an output 45 from burst control unit 17 will temporarily inhibit the resetting of counters until the burst has been completed. After the switch bouncing has ceased and counter 21 has reached a predetermined state which control unit 13 latches by means of the gates 47, 49, 51, and 53. The output of gate 51 then serves as a signal to mode control unit 15 to advance a mode select counter which e.g., may consist of three flip-flops 55, 57, and 59. When switch 11 is manually depressed a second time the same procedure is repeated. In the present example the switch would not be released after the second push, but would be held, or locked, in the down position for a period of time (as determined by counter 21). When this occurs, a latch including gates 61 and 63 will be activated and generate a signal to ROM 19 which enables the ROM to monitor the high or low state of the various input lines thereto. Depending on which of these lines is activated at this time the ROM matrix will respond by providing suitable output signals to output control unit 29, display drive 27 and the other circuits. In the present example, the ROM will activate burst control unit 17 to generate suitable pulses and pauses comprising pulse bursts of 100 pulses each.

I claim:

1. A logic pulser for generating electronic pulses to induce changes of state in digital logic circuitry under test, said pulser comprising:

means for generating pulses in a plurality of operating modes comprising (1) single pulses, (2) continuous streams of pulses, and (3) recurring pulse bursts containing a predetermined number of pulses; and coding means for serially encoding mode selection commands to select among said plurality of operating modes.

2. A logic pulser as in claim 1 wherein said coding means comprises:

a push button switch adapted for manual operation; and control means responsive to signals from said push button switch for serially encoding mode selection commands.

3. A logic pulser as in claim 1 further comprising display means for providing a visual indication of the operating mode of said pulser.

4. A logic pulser as in claim 3 wherein said display means comprises:

an optical output element; and display drive means for driving said optical output element to provide a serially coded visual indication of the operating mode of said pulser.

5. A logic pulser as in claim 1 further comprising output means for providing output pulses of varying pulse width responsive to the amount of charge being delivered to the digital logic circuitry under test.

6. A logic pulser as in claim 5 wherein said output means comprises:

a one-shot circuit to provide pulses of a nominal pulse width;

a pair of output sensing circuits to sense the charge delivered to the logic circuitry under test; and means for adjusting the width of the pulses from said one-shot circuit in response to signals from said output sensing circuits.

* * * * *

UNITED STATES PATENT AND TRADEMARK OFFICE
CERTIFICATE OF CORRECTION

PATENT NO. : 3,965,468
DATED : June 22, 1976
INVENTOR(S) : Barry Steven Bronson

It is certified that error appears in the above-identified patent and that said Letters Patent are hereby corrected as shown below:

Column 1, line 19, delete "not";

Column 4, line 24, cancel "Q" (second occurrence) and substitute -- $\bar{Q}$ --;

Column 5, line 10, cancel "output" and substitute -- input --;

Column 5, line 14, cancel "which" and substitute -- switch --.

Signed and Sealed this

Fifth Day of October 1976

[SEAL]

Attest:

RUTH C. MASON
Attesting Officer

C. MARSHALL DANN
Commissioner of Patents and Trademarks